United States Patent
Fujii et al.

(10) Patent No.: US 9,112,067 B2
(45) Date of Patent: Aug. 18, 2015

(54) SEMICONDUCTOR DEVICE AND MANUFACTURING METHOD THEREOF

(75) Inventors: Teruyuki Fujii, Atsugi (JP); Kohei Ohshima, Atsugi (JP); Junya Maruyama, Ebina (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1106 days.

(21) Appl. No.: 12/766,389

(22) Filed: Apr. 23, 2010

(65) Prior Publication Data

US 2010/0275989 A1   Nov. 4, 2010

(30) Foreign Application Priority Data

May 2, 2009   (JP) .................................. 2009-112367

(51) Int. Cl.
H01L 31/0224 (2006.01)
H01L 31/0296 (2006.01)
H01L 31/02 (2006.01)
H01L 31/028 (2006.01)
H01L 31/068 (2012.01)
H01L 31/075 (2012.01)

(52) U.S. Cl.
CPC .... H01L 31/022425 (2013.01); H01L 31/0296 (2013.01); *H01L 31/028* (2013.01); *H01L 31/02008* (2013.01); *H01L 31/068* (2013.01); *H01L 31/075* (2013.01); *Y02E 10/50* (2013.01)

(58) Field of Classification Search
CPC ................ H01L 31/00; H01L 31/0244; H01L 31/02425; H01L 31/18; H01L 31/0224; H01L 31/022425; H01L 31/022433; H01L 31/1804
USPC ................ 136/243–265; 438/57–98
See application file for complete search history.

(56) References Cited

U.S. PATENT DOCUMENTS

| | | | | |
|---|---|---|---|---|
| 5,252,142 A | * | 10/1993 | Matsuyama et al. | 136/255 |
| 6,268,233 B1 | * | 7/2001 | Sano | 438/57 |
| 6,313,398 B1 | | 11/2001 | Yamada et al. | |
| 6,335,535 B1 | | 1/2002 | Miyake et al. | |
| 6,890,849 B2 | | 5/2005 | Kado et al. | |

(Continued)

FOREIGN PATENT DOCUMENTS

| | | |
|---|---|---|
| JP | 06-204516 A | 7/1994 |
| JP | 10-335683 A | 12/1998 |
| JP | 2000-021597 | 1/2000 |
| JP | 2000-077287 | 3/2000 |
| JP | 2000-183377 | 6/2000 |
| JP | 2001-064007 | 3/2001 |
| JP | 2001-068709 A | 3/2001 |
| JP | 2001-077044 | 3/2001 |
| JP | 2001-089291 | 4/2001 |
| JP | 2003-017723 | 1/2003 |
| JP | 2004-134771 A | 4/2004 |
| WO | WO03/003434 | 1/2003 |

*Primary Examiner* — Christina Chern
(74) *Attorney, Agent, or Firm* — Eric J. Robinson; Robinson Intellectual Property Law Office, P.C.

(57) ABSTRACT

An object relates to an electrode of a semiconductor device or a method for manufacturing a semiconductor device, which includes a bonding step, and problems are: (1) high resistance of a semiconductor device due to the use of an Al electrode, (2) formation of an alloy by Al and Si, (3) high resistance of a film formed by a sputtering method, and (4) defective bonding in a bonding step which is caused if a bonding surface has a large unevenness. A semiconductor device includes a metal substrate or a substrate provided with a metal film, a copper (Cu) plating film over and bonded to the metal substrate or the metal film by employing a thermocompression bonding method, a barrier film over the Cu plating film, a single crystal silicon film over the barrier film, and an electrode layer over the single crystal silicon film.

6 Claims, 12 Drawing Sheets

(56) References Cited

U.S. PATENT DOCUMENTS

| | | |
|---|---|---|
| 7,138,715 B2 | 11/2006 | Kado et al. |
| 2001/0055854 A1* | 12/2001 | Nishida et al. ............... 438/455 |
| 2008/0128013 A1* | 6/2008 | Lopatin et al. ............. 136/244 |
| 2008/0128268 A1* | 6/2008 | Lopatin et al. ............ 204/192.1 |
| 2008/0216891 A1* | 9/2008 | Harkness et al. ............. 136/256 |
| 2009/0079024 A1 | 3/2009 | Yamazaki |
| 2010/0019387 A1* | 1/2010 | Miura ........................ 257/773 |
| 2010/0236619 A1* | 9/2010 | Tsutsumi et al. ............ 136/256 |

* cited by examiner

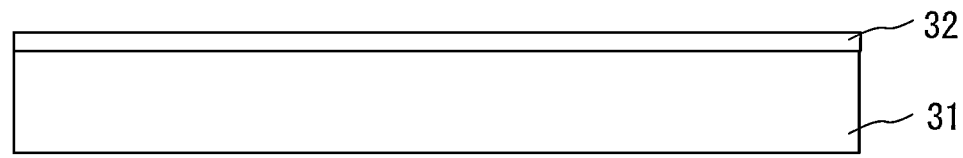
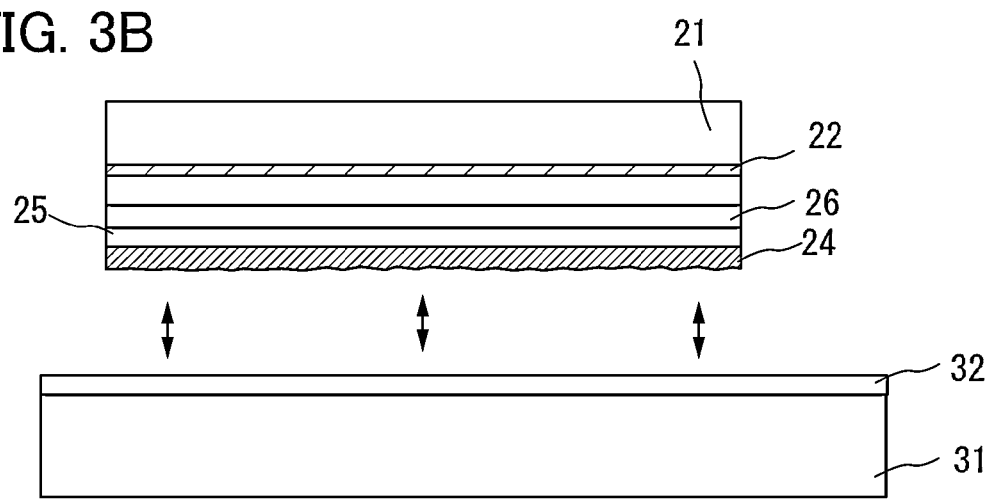
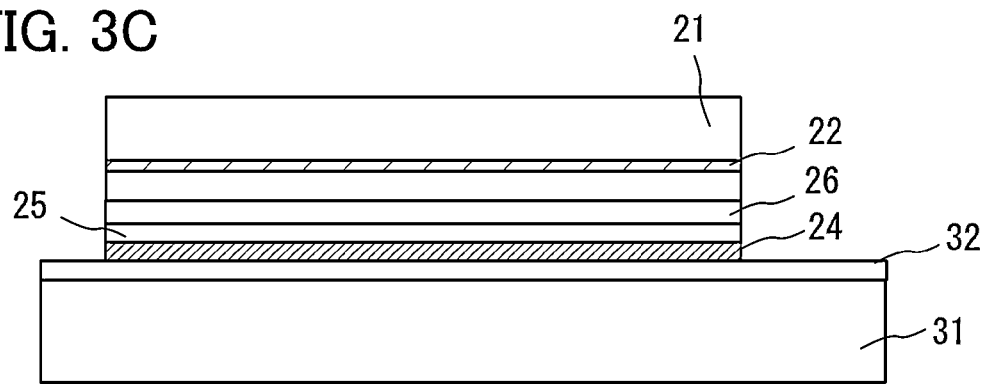

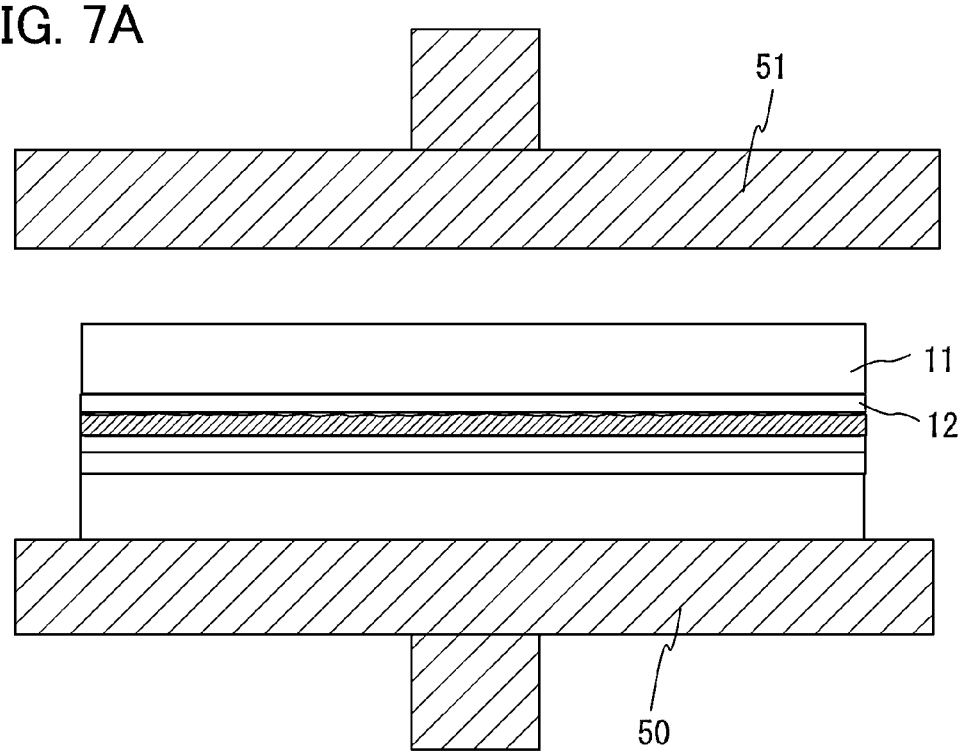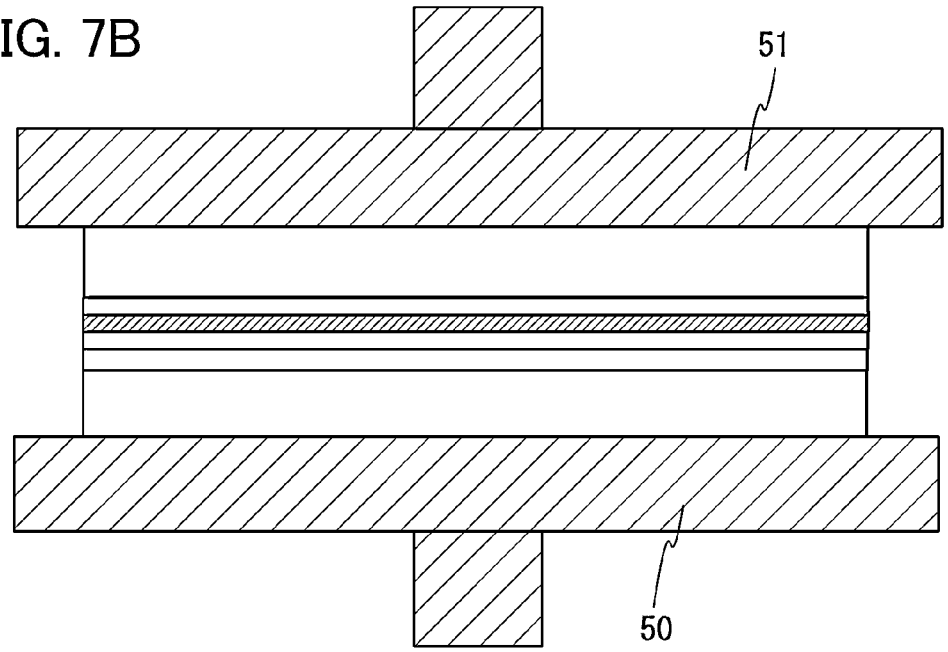

Cu film, single crystal silicon film single crystal silicon film 33
TaN film
Cu film
glass substrate

SEMICONDUCTOR DEVICE AND MANUFACTURING METHOD THEREOF

BACKGROUND OF THE INVENTION

1. Field of the Invention

The present invention relates to semiconductor devices such as photoelectric conversion devices including solar cells and a manufacturing method thereof.

2. Description of the Related Art

Patent Document 1 discloses a method for manufacturing a solar cell, in which a silicon (Si) film is formed over a substrate by bonding a silicon wafer to the substrate and separating the silicon film from the silicon wafer.

The method for manufacturing a solar cell, which is disclosed in FIGS. 10A to 10D of Patent Document 1, is as follows. A bonding metal layer such as an evaporated aluminum (Al) layer is formed over a silicon wafer in which hydrogen has been implanted. The bonding metal layer and an Al-based metal substrate are disposed in close contact with each other. A part of the silicon wafer is separated by heat treatment at 400° C. to 600° C., whereby a silicon film is formed over the Al-based metal substrate with the bonding metal layer interposed therebetween, and the bonding metal layer and the Al-based metal substrate are bonded to each other. The Al-based metal substrate functions as a cathode electrode. An anode electrode is formed over the silicon film. In this manner, a solar cell is manufactured.

[Reference]
[Patent Document]
[Patent Document 1] Japanese Published Patent Application No. 2003-17723

SUMMARY OF THE INVENTION

Problems to be solved by an embodiment of the present invention relate to an electrode of a semiconductor device or a method for manufacturing a semiconductor device, which includes a bonding step. Specific problems are the following: (1) high resistance of a semiconductor device due to the use of an Al electrode, (2) formation of an alloy by Al and Si, (3) high resistance of a film formed by a sputtering method, and (4) defective bonding in a bonding step which is caused if a bonding surface has a large unevenness. The problems (1) to (4) are hereinafter described.

(1) In Patent Document 1, a bonding metal layer such as an evaporated Al layer is formed over a silicon wafer, and the bonding metal layer and an Al-based metal substrate are used as a back electrode. However, the resistivity of Al is about $2.66 \times 10^{-8}$ Ωm, which is relatively high. Therefore, the high resistance causes a loss when electromotive force generated in a solar cell is taken out.

(2) It is known that Al forms an alloy with Si. When an alloy is formed, Al diffuses into a Si film and the Si film becomes unable to function as a photoelectric conversion layer.

(3) In general, an electrode is often formed by an evaporation method or a sputtering method as disclosed in Patent Document 1. In particular, a metal film which is formed by a sputtering method tends to have low electric conductivity. Although this depends on the element, this is caused by incorporation of a gas used for deposition into a film and an increase in concentration of an impurity in the film.

(4) In Patent Document 1, a bonding metal layer and an Al-based metal substrate are bonded to each other. In the bonding step, planarity of a bonding surface is important. For example, silicon oxide films each having an average surface roughness (Ra) of about 0.4 nm can easily be bonded to each other. On the other hand, if the bonding surface has large unevenness, defective bonding may be caused.

In view of the above problems, an embodiment of the present invention provides a semiconductor device which includes an electrode with low resistivity and does not easily form an alloy with Si. In addition, an embodiment of the present invention discloses a method for manufacturing a semiconductor device without defective bonding.

A semiconductor device according to a first embodiment of the present invention includes a metal substrate or a substrate provided with a metal film, a copper (Cu) plating film over the metal substrate or the metal film, a barrier film over the Cu plating film, a single crystal silicon film over the barrier film, and an electrode layer over the single crystal silicon film.

A Cu film has a resistivity of about $1.67 \times 10^{-8}$ Ωm, which is lower than that of Al. A film formed by a plating method has a higher electrical conductivity than a film formed by a sputtering method.

Because the barrier film is provided, Cu does not form an alloy with Si. Thus, the Si film functions as a photoelectric conversion layer and a highly reliable semiconductor device can be obtained.

A seed film and a Cu plating film which is formed by growth from the seed film may be provided over the metal substrate or the metal film.

The metal substrate may be a Cu substrate, and the substrate provided with the metal film may be a glass substrate provided with a Cu film.

A method for manufacturing a semiconductor device according to a second embodiment of the present invention includes the steps of: forming an embrittled layer in a single crystal silicon substrate which is a first substrate by doping a surface, preferably an entire surface, of the single crystal silicon substrate with ions which are generated from a hydrogen gas; forming a barrier film over the single crystal silicon substrate; forming a Cu plating film over the barrier film; preparing a second substrate which is a metal substrate or a substrate provided with a metal film; bonding the single crystal silicon substrate and the second substrate to each other with the Cu plating film interposed therebetween or with the Cu plating film and the metal film interposed therebetween by thermocompression bonding of the Cu plating film and the metal substrate or the metal film; forming a single crystal silicon film over the second substrate with the Cu plating film interposed therebetween or with the Cu plating film and the metal film interposed therebetween by separating a part of the single crystal silicon substrate along the embrittled layer through heat treatment; and forming an electrode layer over the single crystal silicon film.

In general, a metal film which is formed by sputtering has an average surface roughness (Ra) of about 0.8 nm to 1.5 nm, while a metal plating film has an Ra of about 4 nm. A metal plating film has a more uneven surface than a metal film which is formed by sputtering. Therefore, it is difficult to bond a substrate provided with a metal plating film and a counter substrate to each other. On the other hand, the above-mentioned manufacturing method enables bonding even if a surface has large unevenness.

The thermocompression bonding may be performed at a temperature equal to or higher than 150° C. and lower than the allowable temperature limits of the first substrate and the second substrate and with a pressure equal to or higher than 0.5 MPa and equal to or lower than 20 MPa. Alternatively, the thermocompression bonding may be performed at a temperature equal to or higher than 150° C. and lower than the allowable temperature limits of the first substrate and the second substrate and with a pressure equal to or higher than 2.0 MPa and equal to or lower than 20 MPa.

A seed film may be formed over the first substrate and the Cu plating film may be formed by growth from the seed film.

The metal substrate may be a Cu substrate and the substrate provided with the metal film may be a glass substrate provided with a Cu film.

Note that semiconductor devices include photoelectric conversion devices and include solar cells.

A Cu plating film has a lower resistance than an Al film or a sputtered film. With the use of a Cu plating film for an electrode of a photoelectric conversion device such as a solar cell, charges generated by light can be efficiently taken out. In addition, because a barrier film is provided, Cu does not form an alloy with Si and a highly reliable semiconductor device can be obtained. Although a substrate provided with a Cu plating film having a highly uneven surface is used, the substrate and a counter substrate can easily be bonded to each other by thermocompression bonding.

BRIEF DESCRIPTION OF THE DRAWINGS

FIGS. 3A to 3C are cross-sectional views illustrating Embodiment 2.

FIGS. 7A and 7B are cross-sectional views illustrating Example 1.

DETAILED DESCRIPTION OF THE INVENTION

Embodiments 1 and 2 of the present invention will be described below. Note that the present invention can be carried out in many different modes, and it is easily understood by those skilled in the art that the modes and details of the present invention can be modified in various ways without departing from the purpose and the scope of the present invention. Therefore, the present invention should not be construed as being limited to the description in the embodiments.

Embodiment 1 discloses a semiconductor device, and Embodiment 2 discloses a method for manufacturing a semiconductor device.

(Embodiment 1)

Figure 1A:
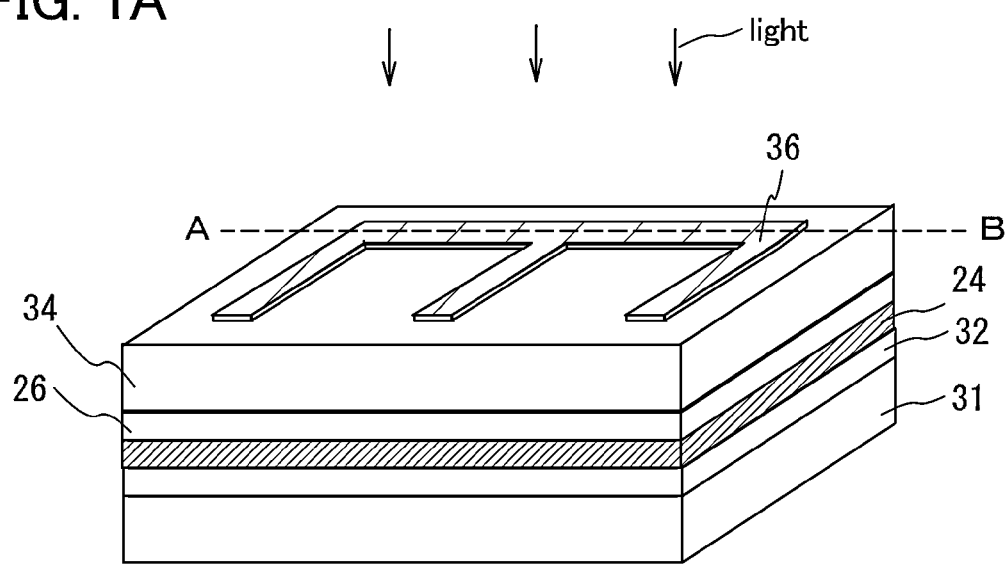
FIGS. 1A and 1B are a perspective view and a cross-sectional view illustrating Embodiment 1.
Figure 1B:
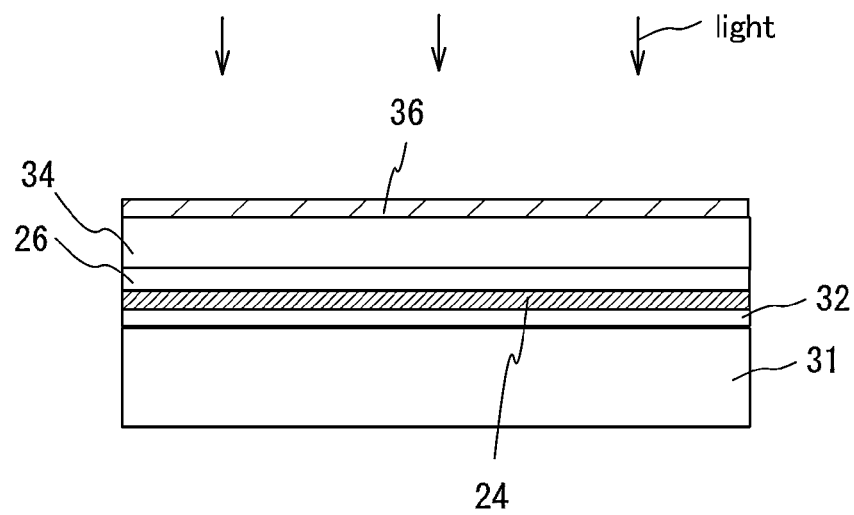

Embodiment 1 discloses with reference to FIGS. 1A and 1B a semiconductor device including a metal substrate or a substrate provided with a metal film, a copper (Cu) plating film over the metal substrate or the metal film, a barrier film over the Cu plating film, a single crystal silicon film over the barrier film, and an electrode layer over the single crystal silicon film.

FIG. 1A is a perspective view of a semiconductor device, and FIG. 1B is a cross-sectional view taken along the broken line A-B of FIG. 1A.

The semiconductor device includes a metal film 32 over a substrate 31, a Cu plating film 24 over the metal film 32, a barrier film 26 over the Cu plating film 24, a single crystal silicon film 34 over the barrier film 26, and an electrode layer 36 over the single crystal silicon film 34.

The substrate 31 may be, for example, an insulating substrate such as a glass substrate, a quartz substrate, a ceramic substrate, or a plastic substrate, a semiconductor substrate such as a silicon substrate or a silicon germanium substrate, or a metal substrate such as an Al substrate, a Cu substrate, a Ni substrate, or the like. In the case where a metal substrate is used, a Cu substrate is preferable.

The metal film 32 with a thickness of 50 nm to 300 nm is formed over the substrate 31. The metal film 32 is formed using a known method such as evaporation, sputtering, or CVD. The metal film 32 may be an Al film, an Al—Nd alloy film, an Ag film, an Au film, a Pt film, an Ag—Pd—Cu alloy film, or a Cu film and is preferably a Cu film. In the case where a metal substrate is used as the substrate 31, the metal film 32 is not necessarily provided.

The Cu plating film 24 is formed to a thickness of 500 nm to 1.5 μm through known electroplating or electroless plating. The Cu plating film 24 has a higher electrical conductivity than an Al film. In the Cu plating film 24, a gas used for a sputtering method is not incorporated. Thus, the Cu plating film 24 has a higher electrical conductivity than a sputtered film. Furthermore, because plating is employed, the thickness of the Cu plating film 24 can easily be increased.

In the case where the Cu plating film 24 is formed using electroplating, a seed film is formed with a metal or an alloy and the Cu plating film 24 is then formed by growth from the seed film. For the seed film, Cu, Pd, titanium (Ti), Ni, Cr, Ag, Au or titanium-tungsten (TiW), nickel-iron (NiFe), or an alloy thereof is used. The seed film is formed to a thickness of 50 nm to 300 nm using a known method such as evaporation or sputtering. In the case where electroless plating is employed, the seed film is not necessary.

For the barrier film 26, titanium nitride, titanium (Ti), tantalum nitride, tantalum (Ta), tungsten nitride, tungsten (W), or the like is used. The barrier film 26 may be a single-layer film or a stacked-layer film. The barrier film 26 can be formed to a thickness of 10 nm to 100 nm using a known method such as evaporation or sputtering. The barrier film 26 prevents Cu of the Cu plating film 24 from diffusing into the single crystal silicon film 34. Accordingly, Cu and Si do not form an alloy, and a highly reliable semiconductor device can be obtained.

The single crystal silicon film 34 may be a single-layer film of an i-type single crystal silicon film, a stacked-layer film in which a p-type single crystal silicon film and an n-type single crystal silicon film are stacked in this order over the substrate 31, a stacked-layer film in which an n-type single crystal silicon film and a p-type single crystal silicon film are stacked in this order over the substrate 31, a stacked-layer film in which a p-type single crystal silicon film, an i-type single crystal silicon film, and an n-type single crystal silicon film are stacked in this order over the substrate 31, or a stacked-layer film in which an n-type single crystal silicon film, an i-type single crystal silicon film, and a p-type single crystal silicon film are stacked in this order over the substrate 31. The single crystal silicon film 34 can be formed using a method described in Embodiment 2. The single crystal silicon film 34 can be formed to a thickness of 150 nm to 600 nm.

Light enters the single crystal silicon film 34 from the electrode layer 36 side. The electrode layer 36 is formed with a transparent conductive material using a sputtering method or an evaporation method. As the transparent conductive material, metal oxide such as indium tin oxide alloy (ITO), zinc oxide, tin oxide, indium zinc oxide alloy, or the like may be used. The electrode layer 36 can be formed in a comb-like shape (FIG. 1A) or a grid shape.

A passivation film covering the electrode layer 36 and the single crystal silicon film 34 may be formed with a silicon oxide film, a silicon nitride film, a silicon oxynitride film, or a stacked-layer film thereof using CVD or the like (not shown). The passivation film can function as a protective film and an anti-reflection film.

The Cu plating film 24 has a higher electrical conductivity than an Al film. The Cu plating film 24 has a higher electrical conductivity than a sputtered film. In addition, because the barrier film 26 is provided, Cu does not form an alloy with Si and a highly reliable semiconductor device can be obtained.

(Embodiment 2)

Embodiment 2 discloses with reference to FIGS. 2A and 2B, FIGS. 3A to 3C, FIGS. 4A to 4C, and FIG. 5 a method for manufacturing a semiconductor device, which includes the steps of: forming an embrittled layer in a single crystal silicon substrate which is a first substrate by doping a surface, preferably an entire surface, of the single crystal silicon substrate with ions which are generated from a hydrogen gas; forming a barrier film over the single crystal silicon substrate; forming a Cu plating film over the barrier film; preparing a second substrate which is a metal substrate or a substrate provided with a metal film; bonding the single crystal silicon substrate and the second substrate to each other with the Cu plating film interposed therebetween or with the Cu plating film and the metal film interposed therebetween by thermocompression bonding of the Cu plating film and the metal substrate or the metal film; forming a single crystal silicon film over the second substrate with the Cu plating film interposed therebetween or with the Cu plating film and the metal film interposed therebetween by separating a part of the single crystal silicon substrate along the embrittled layer through heat treatment; and forming an electrode layer over the single crystal silicon film.

A single crystal silicon substrate 21 which is a first substrate is prepared. As the single crystal silicon substrate 21, an n-type single crystal silicon substrate, an i-type single crystal silicon substrate, or a p-type single crystal silicon substrate is used. In Embodiment 2, the case where a p-type single crystal silicon substrate is used as the single crystal silicon substrate 21 is described.

Figure 2A:
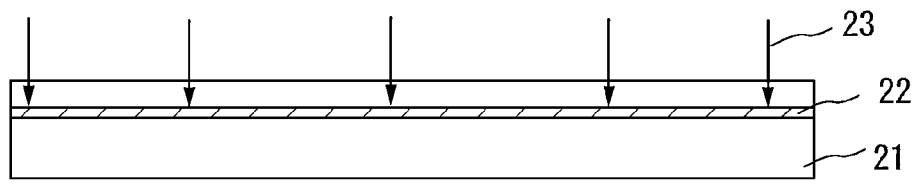
FIGS. 2A and 2B are cross-sectional views illustrating Embodiment 2.

The single crystal silicon substrate 21 is doped with ions 23 which are generated from a hydrogen ($H_2$) gas, whereby an embrittled layer 22 is formed (FIG. 2A). The present invention is not limited to an $H_2$ gas, and phosphine ($PH_3$), diborane ($B_2H_6$), or the like may be used. The dose of the ions 23 is not particularly limited. The energy of the ions 23 or the like is adjusted such that the embrittled layer 22 is formed at a depth of 50 nm to 200 nm from a surface of the single crystal silicon substrate 21.

In the above-described ion irradiation method, the percentage of $H_3^+$ with respect to the total amount of the generated ion species ($H^+$, $H_2^+$, and $H_3^+$) is set to 50% or higher, preferably 70% or higher. With an increased percentage of $H_3^+$, the cycle time of the ion irradiation step can be shortened, and productivity and throughput can be improved. By irradiation with ions having the same mass, the ions can be added in a concentrated manner to the same depth in the single crystal silicon substrate 21.

Figure 2B:
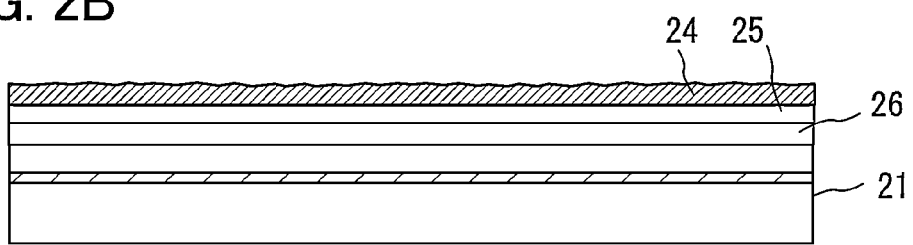

Using the method disclosed in Embodiment 1, a barrier film 26 having a thickness of 10 nm to 100 nm is formed over the single crystal silicon substrate 21 (FIG. 2B).

In the case where electroplating is employed, a seed film 25 is formed over the barrier film 26 (FIG. 2B). The seed film 25 is formed to a thickness of 50 nm to 300 nm using the method disclosed in Embodiment 1. In the case where electroless plating is employed, the seed film 25 is not necessary.

In the case where electroplating is employed, a Cu plating film 24 is formed to a thickness of 500 nm to 1.5 μm by growth from the seed film 25 (FIG. 2B). In the case where electroless plating is employed, the Cu plating film 24 is formed on the barrier film 26. Because plating is employed, the thickness of the Cu plating film 24 can easily be increased. The Cu plating film 24 has a more uneven surface than a metal film which is formed using a sputtering method, an evaporation method, or the like.

Note that an interface is shown in FIG. 2B as being present between the seed film 25 and the Cu plating film 24, but there are cases where no clear interface is present between the seed film 25 and the Cu plating film 24 because the Cu plating film 24 is formed by growth from the seed film 25.

A substrate 31 is prepared (FIG. 3A). The substrate 31 is a second substrate. As the substrate 31, any of the substrates disclosed in Embodiment 1 can be used. Note that a substrate which can withstand at least the temperature of heat treatment described below is preferable.

A metal film 32 having a thickness of 10 nm to 300 nm is formed over the substrate 31 using a known method such as evaporation, sputtering, or CVD (FIG. 3A). The metal film 32 is preferably a Cu film. In the case where a metal substrate is used, the metal film 32 is not necessarily provided.

The single crystal silicon substrate 21 and the substrate 31 are disposed in such a manner that the Cu plating film 24 and the metal film 32 face each other (FIG. 3B) and are bonded to each other by thermocompression bonding with the use of a hot pressing apparatus (FIG. 3C). The thermocompression bonding is performed at 150° C. to 300° C. with 0.5 MPa to 20 MPa. Alternatively, the thermocompression bonding is performed at a temperature equal to or higher than 150° C. and lower than the allowable temperature limits of the first substrate and the second substrate and with 2.0 MPa to 20 MPa. The reason the upper limit of temperature is 300° C. is because a part of the single crystal silicon substrate 21 is separated through heat treatment at 400° C. or higher as described below. The thermocompression bonding can be performed in 5 minutes to 4 hours.

Figure 4A:
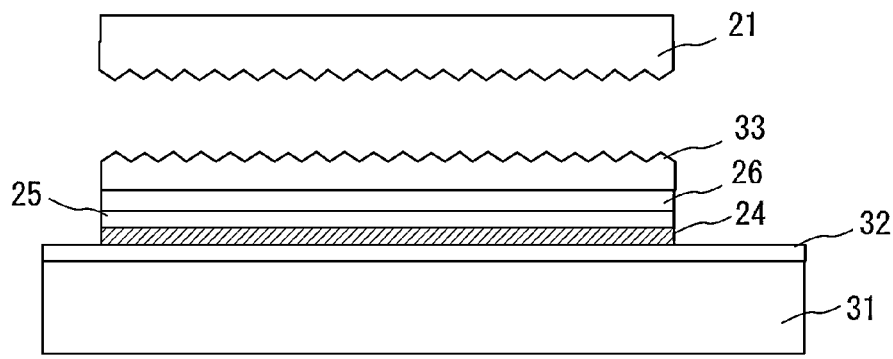
FIGS. 4A to 4C are cross-sectional views illustrating Embodiment 2.

After being bonded to each other, the single crystal silicon substrate 21 and the substrate 31 are taken out from the hot pressing apparatus. Next, heat treatment is performed at 400° C. or higher. The heat treatment causes a change in volume of minute voids which are formed in the embrittled layer 22. Due to this change in volume, a part of the single crystal silicon substrate 21 is separated along the vicinity of the embrittled layer 22, which enables a single crystal silicon film 33 having a thickness of 50 nm to 200 nm to be formed over the substrate 31 with the metal film 32, the Cu plating film 24, and the barrier film 26 interposed therebetween (FIG. 4A).

For the heat treatment, a diffusion furnace, a heating furnace such as a resistance heating furnace, a rapid thermal annealing (RTA) apparatus, a microwave heating apparatus, or the like can be used. The temperature of the heat treatment is set to a temperature equal to or higher than 400° C. and lower than the allowable temperature limit of the single crystal silicon substrate 21 and that of the substrate 31. For example, in the case where the single crystal silicon substrate 21 is used and a glass substrate is used as the substrate 31, the heat treatment is performed at 400° C. to 650° C. for 0.5 hours to 5 hours.

Figure 4B:
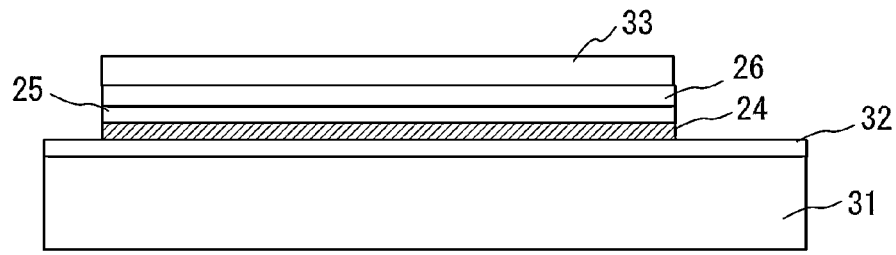

A surface of the single crystal silicon film 33 has defects or large unevenness, and the defects may be reduced or the surface may be planarized using laser light irradiation, CMP, or the like (FIG. 4B).

Figure 4C:
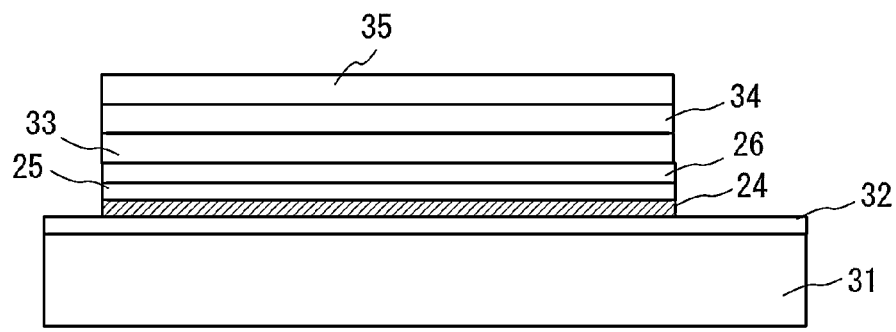

As mentioned above, the single crystal silicon substrate 21 is a p-type single crystal silicon substrate. Therefore, the single crystal silicon film 33 is a p-type single crystal silicon film. An i-type single crystal silicon film 34 having a thickness of 50 nm to 200 nm is formed over the p-type single crystal silicon film 33, and an n-type single crystal silicon film 35 having a thickness of 50 nm to 200 nm is formed over the i-type single crystal silicon film 34 (FIG. 4C).

In Embodiment 2, the i-type single crystal silicon film 34 and the n-type single crystal silicon film 35 are formed using an epitaxial growth technique such as solid-phase growth (solid-phase epitaxial growth) or gas-phase growth (gas-phase epitaxial growth).

First, an i-type amorphous silicon film or an i-type crystalline silicon film is formed over the p-type single crystal silicon film 33 using a CVD method or the like. By solid-phase growth of the i-type amorphous silicon film or the i-type crystalline silicon film, the i-type single crystal silicon film 34 is formed.

Over the i-type single crystal silicon film 34, an n-type amorphous silicon film or an n-type crystalline silicon film is formed using a CVD method or the like. By solid-phase growth of the n-type amorphous silicon film or the n-type crystalline silicon film, the n-type single crystal silicon film 35 is formed.

Heat treatment for solid-phase growth is performed with the above-mentioned heat treatment apparatus such as an RTA apparatus, a furnace, or a high-frequency generation apparatus.

The method for forming the i-type single crystal silicon film 34 and the n-type single crystal silicon film 35 is not limited to the aforementioned method. For example, a single crystal silicon film may be formed by laser light irradiation of an amorphous silicon film or a crystalline silicon film which is formed using a CVD method or the like.

Figure 5:
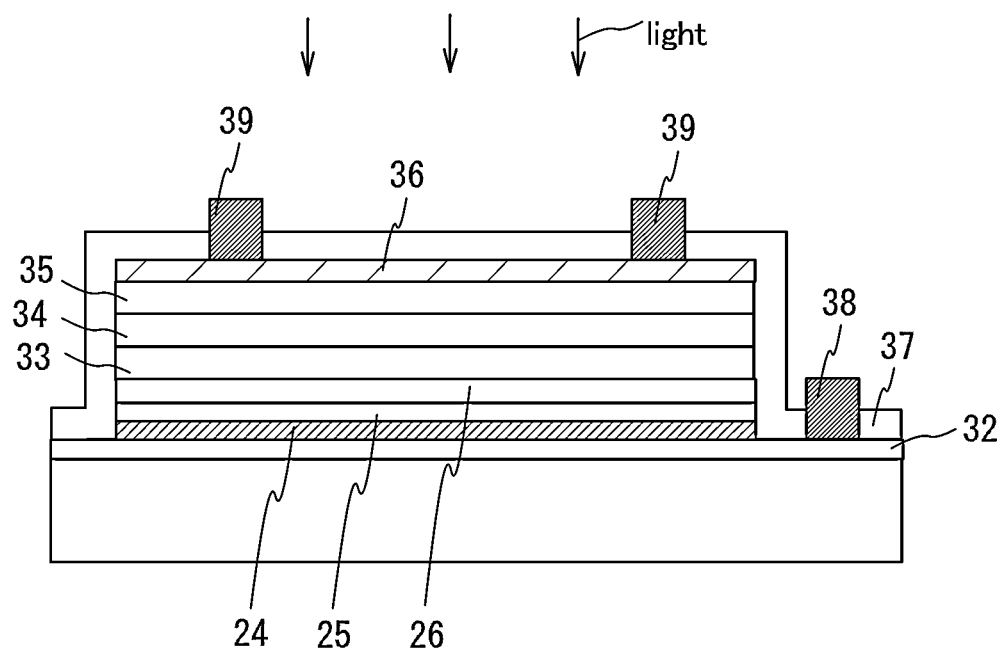
FIG. 5 is a cross-sectional view illustrating Embodiment 2.

An electrode layer 36 is formed over the n-type single crystal silicon film 35 (FIG. 5). Because the electrode layer 36 side is a light incident plane, the electrode layer 36 is formed with a transparent conductive material using a sputtering method or a vacuum evaporation method. Metal oxide such as indium tin oxide alloy, zinc oxide, tin oxide, indium zinc oxide alloy, or the like is used. The shape of the upper surface of the electrode layer 36 may be a comb-like shape (FIG. 1A) or a grid shape.

A passivation film 37 is formed with a silicon oxide film or the like using a CVD method or the like (FIG. 5). The passivation film 37 functions as a protective film and an anti-reflection film.

Contact holes are formed in the passivation film 37, and a wiring 38 which is electrically connected to the metal film 32 and a wiring 39 which is electrically connected to the electrode layer 36 are formed using an evaporation method, photolithography, or the like (FIG. 5). When the wirings 38 and 39 are formed using a printing method, a droplet discharge method, or the like, a photomask is not necessary. The wirings 38 and 39 and the passivation film 37 are formed as necessary.

In this manner, it is possible to realize a semiconductor device which includes a Cu plating film with high electrical conductivity over a metal substrate or a substrate provided with a metal film and a single crystal silicon film over the Cu plating film. A surface of the Cu plating film is more uneven than a surface of a metal film formed using a sputtering method, an evaporation method, or the like. Thus, the Cu plating film and a counter substrate are difficult to bond to each other, whereas they can be bonded to each other by the manufacturing method of an embodiment of the present invention.

During Cu plating, the single crystal silicon substrate is immersed in a plating solution. Thus, the second substrate is not exposed to the plating solution.

Although a p-type single crystal silicon substrate is used as the single crystal silicon substrate 21, an n-type single crystal silicon substrate may be used. In this case, the single crystal silicon film 33 is an n-type single crystal silicon film and the single crystal silicon film 35 is a p-type single crystal silicon film. Furthermore, an i-type single crystal silicon substrate may be used.

Note that Embodiment 2 can be combined with Embodiment 1 as appropriate.

Example 1

Example 1 discloses with reference to FIGS. 6A and 6B, FIGS. 7A and 7B, and FIG. 8 a method for manufacturing a semiconductor device in which a first substrate with a Cu plating film and a second substrate provided with a metal film are bonded to each other with the Cu plating film and the metal film interposed therebetween through thermocompression bonding.

A Ti film, a titanium nitride film, or a tantalum nitride film having a thickness of 25 nm to 100 nm was formed using a sputtering method as a barrier film 4 over a first substrate 1 which is a single crystal silicon substrate.

Figure 6A:
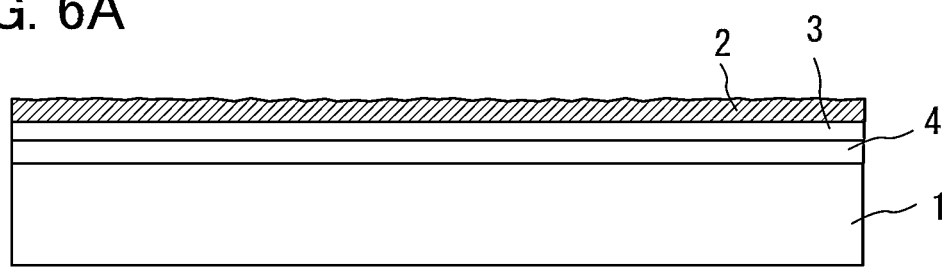
FIGS. 6A and 6B are cross-sectional views illustrating Example 1.

A Ni film, an Ag—Pd—Cu alloy film, or a Cu film having a thickness of 100 nm to 200 nm was formed as a seed film 3 over the barrier film 4 using a sputtering method (FIG. 6A).

A Cu plating film was formed over the seed film 3. The formation of the Cu plating film includes pretreatment, plating treatment, and post-treatment.

The pretreatment is described. The first substrate 1 provided with the seed film 3 and the barrier film 4 was processed in a mixed solution of a phosphoric acid, an organic compound, and water for 5 minutes to 10 minutes and then cleaned with pure water. Next, the first substrate 1 was processed in a 10% hydrochloric acid for 5 minutes to 10 minutes and then cleaned with pure water.

The plating treatment is described. Here, electroplating was employed. As a plating solution, MICROFAB (a registered trademark) Cu300 (manufactured by Electroplating Engineers of Japan Ltd.) was used. Cu300 contains $H_2SO_4$, $CuSO_4(II)$, and an additive. An anode and a cathode were placed in the plating solution and connected to a direct current power source. High phosphorus copper was disposed as an anode and the first substrate 1 was disposed as a cathode. The plating treatment was performed at a current density of 1 $A/dm^2$ to 5 $A/dm^2$ at room temperature. The Cu plating film 2 was formed to 100 nm to 1 μm. After the plating treatment, the first substrate 1 was taken out from the plating solution.

The post-treatment is described. The first substrate 1 was subjected to ultrasonic cleaning with pure water, a 10% sulfuric acid, and a 1% oxalic acid.

In the above manner, the Cu plating film 2 was formed (FIG. 6A). Note that an interface is shown in FIG. 6A as being present between the seed film 3 and the Cu plating film 2, but there are cases where no clear interface is present between the seed film 3 and the Cu plating film 2 because the Cu plating film 2 is formed by growth from the seed film 3.

Figure 6B:
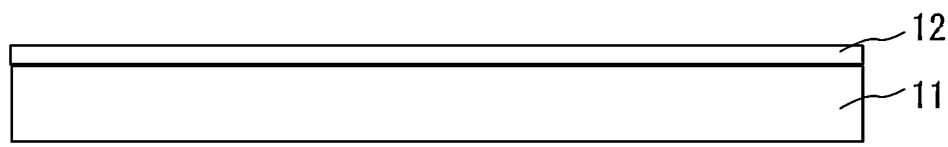

On the other hand, as a second substrate 11, a glass substrate was used. In Example 1, AN100 (manufactured by Asahi Glass Co., Ltd., with a strain point of about 670° C.) having a thickness of 1 mm or less was used. A Cu film having a thickness of 100 nm to 200 nm was formed as a metal film 12 over the second substrate 11 using a sputtering method (FIG. 6B).

The first substrate 1 and the second substrate 11 are bonded to each other through thermocompression bonding with the use of a hot pressing apparatus.

The first substrate 1 and the second substrate 11 were placed over a lower heating platen 50 in the hot pressing apparatus. The first and second substrates were disposed such that the Cu plating film 2 and the Cu film face each other (FIG. 7A). The lower heating platen 50 and an upper heating platen 51 are connected to a heating apparatus (not shown).

The lower heating platen 50 was raised, and the first substrate 1 and the second substrate 11 were bonded to each other through thermocompression bonding with the upper heating platen 51 and the lower heating platen 50 (FIG. 7B). The pressure was 2 MPa to 20 MPa; the temperature, –300° C.; and the length of time for thermocompression bonding, 0.25 hours to 3.5 hours.

Figure 8:
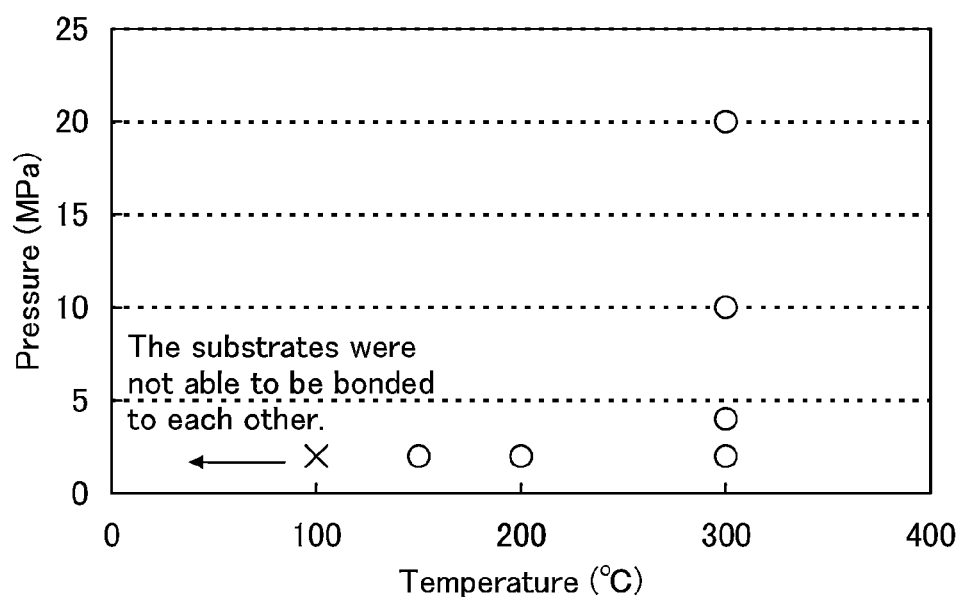
FIG. 8 is a diagram illustrating Example 1.

The results of thermocompression bonding are shown in FIG. 8. The vertical axis represents pressure (Pa). The horizontal axis represents temperature (° C.). Circle marks mean that the first substrate 1 and the second substrate 11 were able to be bonded to each other, and cross marks mean that the substrates were not able to be bonded to each other. The first substrate 1 and the second substrate 11 were able to be bonded to each other at 150° C. to 300° C. with 2 MPa to 20 MPa. The substrates were able to be bonded to each other through thermocompression bonding in 0.25 hours or longer. The substrates were not able to be bonded to each other at a temperature of 100° C. or lower. Although the lower limit of pressure was 2 MPa due to limitations of the hot pressing apparatus, the substrates can be bonded to each other with 0.5 MPa or more.

Note that an interface is shown in FIG. 7B as being present between the metal film 12 and the Cu plating film 2, but there are cases where no clear interface is present between the metal film 12 and the Cu plating film 2 if the metal film 12 and the Cu plating film 2 are made with the same metal (Cu).

Example 2

In Example 2, an Al—Nd film or an Ag—Pd—Cu alloy film was formed as the metal film 12 over the second substrate 11 using a sputtering method. The other conditions are the same as those in Example 1.

The first substrate 1 and the second substrate 11 were able to be bonded to each other at 150° C. to 300° C. with 2 MPa to 20 MPa. Although the lower limit of pressure was 2 MPa due to limitations of the hot pressing apparatus, the substrates can be bonded to each other with 0.5 MPa or more.

Example 3

Example 3 discloses with reference to FIGS. 9A to 9C, FIGS. 10A and 10B, FIGS. 11A and 11B, and FIGS. 12A and 12B the steps of: forming an embrittled layer in a single crystal silicon substrate which is a first substrate by doping an entire surface of the single crystal silicon substrate with ions which are generated from a hydrogen gas; forming a barrier film over the single crystal silicon substrate; forming a Cu plating film over the barrier film; preparing a second substrate which is a substrate provided with a metal film; bonding the single crystal silicon substrate and the second substrate to each other with the Cu plating film and the metal film interposed therebetween by thermocompression bonding of the Cu plating film and the metal film; and forming a single crystal silicon film over the second substrate with the Cu plating film and the metal film interposed therebetween by separating a part of the single crystal silicon substrate along the embrittled layer through heat treatment.

Figure 9A:
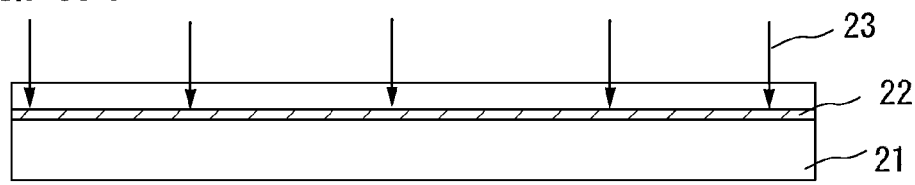
FIGS. 9A to 9C are cross-sectional views illustrating Example 3.

A single crystal silicon substrate 21 was doped with ions 23 which were generated from an $H_2$ gas, whereby an embrittled layer 22 was formed (FIG. 9A). The flow rate of the $H_2$ gas was 50 sccm; the acceleration voltage, 80 kV; the current density, 5 μA/cm$^2$; and the dose, $2.0\times10^{16}$ cm$^{-2}$. The concentration of hydrogen ions in the single crystal silicon substrate 21 was about $2.0\times10^{21}$ cm$^{-3}$.

A tantalum nitride film or a titanium nitride film having a thickness of 25 nm was formed as a barrier film 26 over the single crystal silicon substrate 21 using a sputtering method.

A Cu film or a Ni film was formed as a seed film 25 over the barrier film 26 using a sputtering method. The thickness of the Cu film was 200 nm, or the thickness of the Ni film was 100 nm.

Figure 9B:
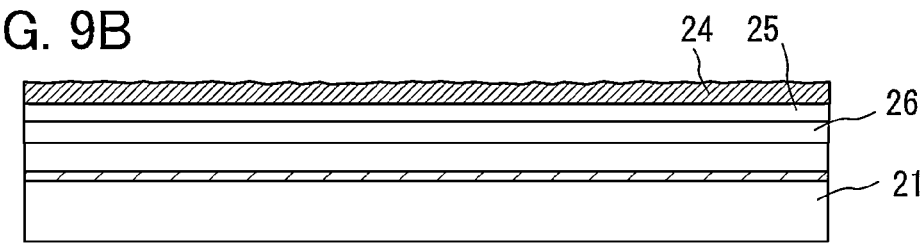

A Cu plating film 24 having a thickness of 1 μm was formed over the seed film 25 with the use of such a method and a material as disclosed in Example 1. Plating treatment was performed at a current density of 2 A/dm$^2$ at room temperature (FIG. 9B). Note that there are cases where no clear interface is present between the seed film 25 and the Cu plating film 24 because the Cu plating film 24 is formed by growth from the seed film 25.

A glass substrate AN100 (manufactured by Asahi Glass Co., Ltd.) was used as a substrate 31.

A Cu film having a thickness of 100 nm to 200 nm was formed as a metal film 32 over the glass substrate using a sputtering method in a manner similar to Example 1.

Figure 9C:
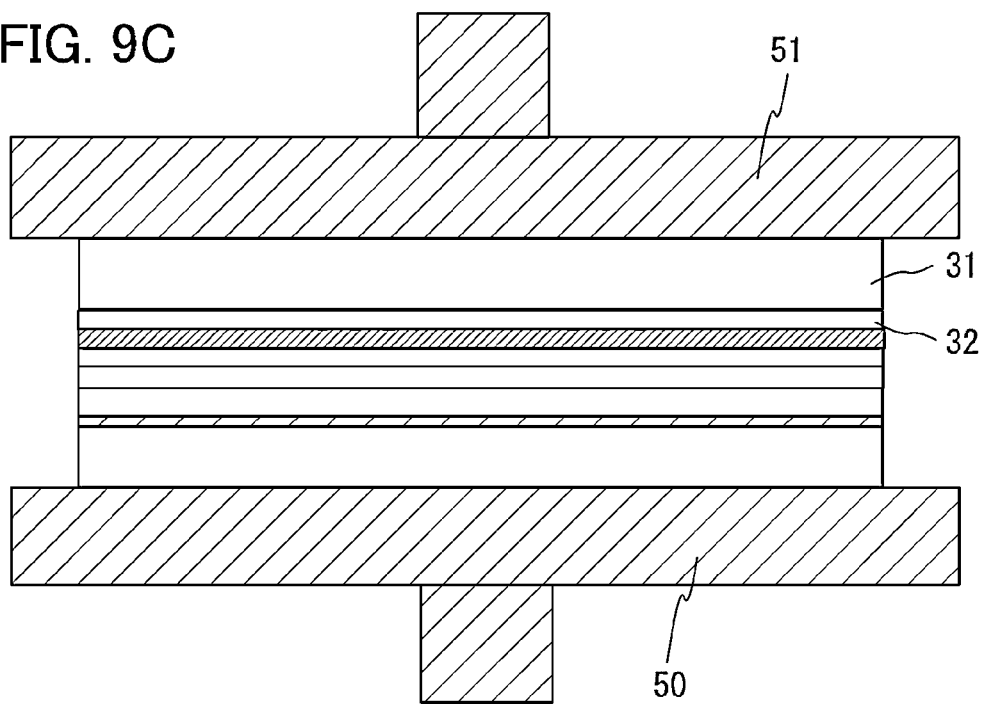
Figure 10A:
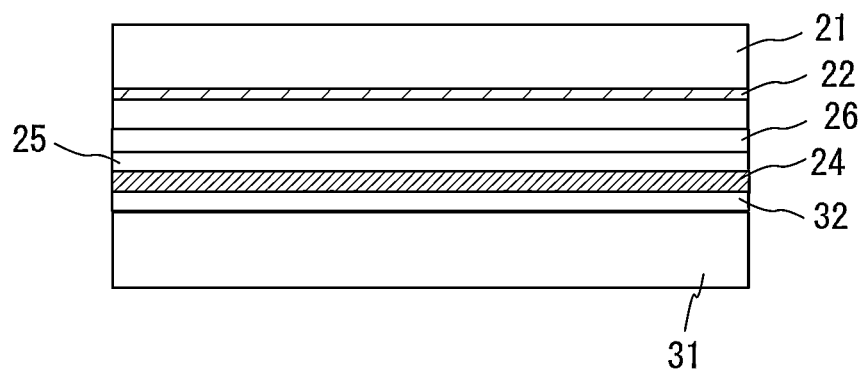
FIGS. 10A and 10B are cross-sectional views illustrating Example 3.

The single crystal silicon substrate 21 and the glass substrate were placed over a lower heating platen 50 in a hot pressing apparatus in such a manner that the Cu plating film 24 and the Cu film face each other. The lower heating platen 50 and an upper heating platen 51 were connected to a heating apparatus (not shown). The lower heating platen 50 was raised, and the single crystal silicon substrate 21 and the glass substrate were bonded to each other through thermocompression bonding with the upper heating platen 51 and the lower heating platen 50 (FIG. 9C). The thermocompression bonding was performed at 150° C. with 2 MPa to 20 MPa. Accordingly, the single crystal silicon substrate 21 and the glass substrate were able to be bonded to each other (FIG. 10A). Although the lower limit of pressure was 2 MPa due to limitations of the hot pressing apparatus, the substrates can be bonded to each other with 0.5 MPa or more. Note that there are cases where no clear interface is present between the metal film 32 and the Cu plating film 24 because both the metal film 32 and the Cu plating film 24 are formed with Cu.

Figure 10B:
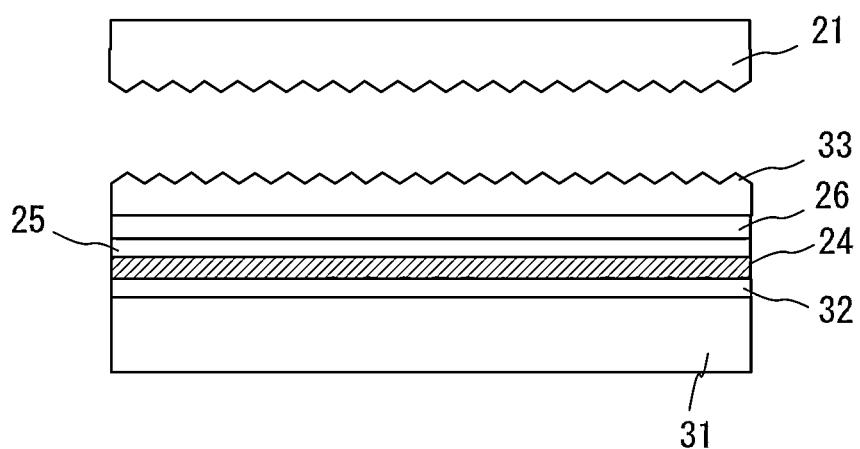

After the thermocompression bonding, the single crystal silicon substrate 21 and the glass substrate bonded to each other were taken out from the hot pressing apparatus and subjected to heat treatment in a heating furnace at 400° C. or higher for 2 hours to 4 hours. A part of the single crystal silicon substrate 21 was separated along the vicinity of the embrittled layer, which enabled a single crystal silicon film 33 having a thickness of 50 nm to 200 nm to be formed over the glass substrate with the Cu film and the Cu plating film 24 interposed therebetween (FIG. 10B).

A glass substrate is shown (FIG. 11A), over which the single crystal silicon film 33 was formed by separation of a part of the single crystal silicon substrate 21 through heat treatment at 600° C. for 2 hours after thermocompression bonding at 150° C. with 10 MPa, with a tantalum nitride film as the barrier film 26 having a thickness of 25 nm and a Cu film as the seed film 25 having a thickness of 200 nm. The single crystal silicon film 33 is formed over the glass substrate. The Cu film is observed at the periphery of the glass substrate.

Figure 11A:
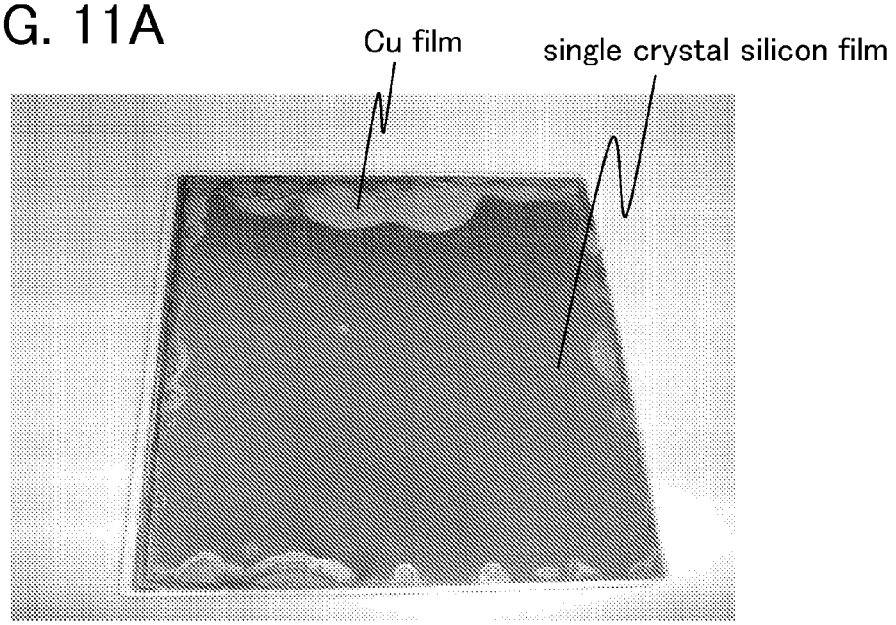
FIGS. 11A and 11B are diagrams illustrating Example 3.
Figure 11B:
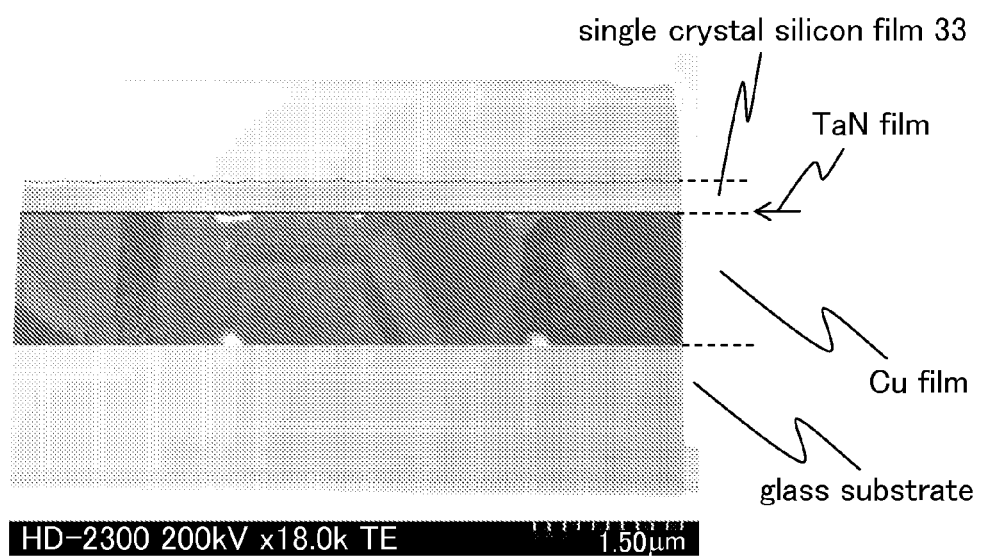

As the result of observation of a cross section of the glass substrate, over which the single crystal silicon film 33 is formed, with a transmission electron microscope (TEM), it can be seen that the single crystal silicon film 33 is formed over the Cu film (FIG. 11B). Note that no interface can be observed between the seed film 25 and the Cu plating film 24 and between the Cu plating film 24 and the metal film 32.

A glass substrate is shown (FIG. 12A), over which the single crystal silicon film 33 was formed by separation of a part of the single crystal silicon substrate 21 through heat treatment at 400° C. for 2 hours and then at 600° C. for 4 hours after thermocompression bonding at 300° C. with 2 MPa, with a titanium nitride film as the barrier film 26 having a thickness of 25 nm and a Ni film as the seed film 25 having a thickness of 100 nm. The single crystal silicon film 33 is formed over the glass substrate. The Cu film is observed at the periphery of the glass substrate.

Figure 12A:
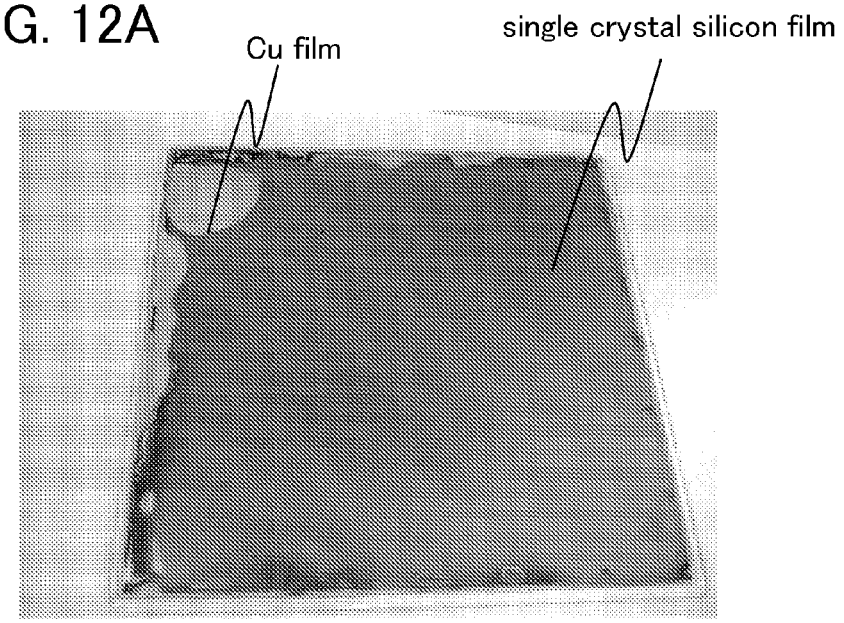
FIGS. 12A and 12B are diagrams illustrating Example 3.
Figure 12B:
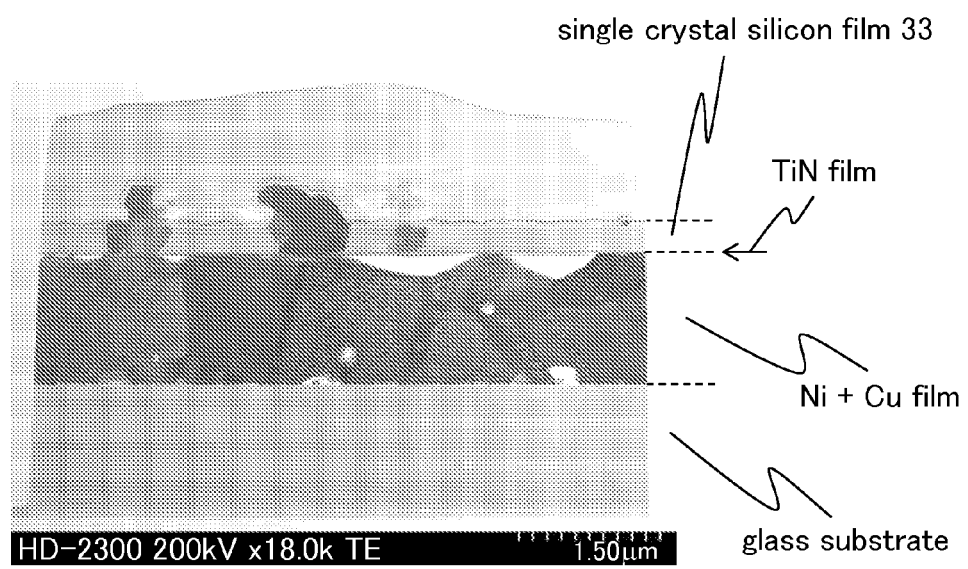

As the result of observation of a cross section of the glass substrate, over which the single crystal silicon film 33 is formed, with a TEM, it can be seen that the single crystal silicon film 33 is formed over the Cu film (FIG. 12B). Note that no interface can be observed between the seed film 25 and the Cu plating film 24 and between the Cu plating film 24 and the metal film 32.

This application is based on Japanese Patent Application serial no. 2009-112367 filed with Japan Patent Office on May 2, 2009, the entire contents of which are hereby incorporated by reference.

What is claimed is:

1. A solar cell comprising:
   an insulating substrate;
   a metal film over and in direct contact with the insulating substrate;
   a copper (Cu) plating film over and in direct contact with the metal film;
   a seed film over and in direct contact with the Cu plating film;
   a barrier film over and in direct contact with the seed film;
   a photoelectric conversion layer over and in direct contact with the barrier film;
   an electrode layer over the photoelectric conversion layer;
   a first wiring over and in direct contact with the metal film, the first wiring does not overlap with the Cu plating film; and
   a second wiring over and in direct contact with the electrode layer,
   wherein the Cu plating film is formed by growth from the seed film,
   wherein the electrode layer is formed with a transparent conductive material,
   wherein the barrier film is one of titanium (Ti) film, tantalum nitride film, tantalum (Ta) film and tungsten (W) film, and
   wherein the photoelectric conversion layer is a single crystal silicon film wherein a thickness of the single crystal silicon film is larger than or equal to 50 nm and smaller than or equal to 200 nm.

2. The solar cell according to claim 1, wherein the transparent conductive material is formed of any one of indium tin oxide alloy, zinc oxide, tin oxide or indium zinc oxide alloy.

3. The solar cell according to claim 1, wherein the metal film is a Cu film.

4. A solar cell comprising:
   an insulating substrate;
   a metal film over and in direct contact with the insulating substrate;
   a copper (Cu) plating film over and in direct contact with the metal film;
   a barrier film over and in direct contact with the Cu plating film;
   a photoelectric conversion layer on the barrier film; and
   an electrode layer over the photoelectric conversion layer;
   a first wiring over and in direct contact with the metal film, the first wiring does not overlap with the Cu plating film; and
   a second wiring over and in direct contact with the electrode layer,
   wherein the electrode layer is formed with a transparent conductive material,
   wherein the barrier film is one of titanium (Ti) film, tantalum nitride film, tantalum (Ta) film and tungsten (W) film, and
   wherein the photoelectric conversion layer is a single crystal silicon film wherein a thickness of the single crystal silicon film is larger than or equal to 50 nm and smaller than or equal to 200 nm.

5. The solar cell according to claim 4, wherein the transparent conductive material is formed of any one of indium tin oxide alloy, zinc oxide, tin oxide or indium zinc oxide alloy.

6. The solar cell according to claim 4, wherein the metal film is a Cu film.

* * * * *